US008859047B2

(12) United States Patent
Gatineau et al.

(10) Patent No.: US 8,859,047 B2
(45) Date of Patent: Oct. 14, 2014

(54) USE OF RUTHENIUM TETROXIDE AS A PRECURSOR AND REACTANT FOR THIN FILM DEPOSITIONS

(75) Inventors: Julien Gatineau, Tsuchiura (JP); Christian Dussarrat, Tokyo (JP)

(73) Assignees: L'Air Liquide, Societe Anonyme pour l'Etude et l'Exploitation des Procedes Georges Claude, Paris (FR); American Air Liquide, Inc., Fremont, CA (US)

( * ) Notice: Subject to any disclaimer, the term of this patent is extended or adjusted under 35 U.S.C. 154(b) by 132 days.

(21) Appl. No.: 13/580,706

(22) PCT Filed: Dec. 22, 2010

(86) PCT No.: PCT/US2010/061907
§ 371 (c)(1),
(2), (4) Date: Nov. 13, 2012

(87) PCT Pub. No.: WO2011/106072
PCT Pub. Date: Sep. 1, 2011

(65) Prior Publication Data
US 2013/0059078 A1 Mar. 7, 2013

Related U.S. Application Data

(60) Provisional application No. 61/307,244, filed on Feb. 23, 2010.

(51) Int. Cl.
*C23C 16/40* (2006.01)
*C23C 16/18* (2006.01)
*C23C 16/455* (2006.01)
*H01L 21/02* (2006.01)

(52) U.S. Cl.
CPC .............. *C23C 16/40* (2013.01); *C23C 16/18* (2013.01); *C23C 16/45531* (2013.01); *H01L 21/02304* (2013.01); *H01L 21/02197* (2013.01)
USPC ....................................... 427/255.31; 117/88

(58) Field of Classification Search
USPC .............. 427/255.28, 255.29, 255.31; 117/88
See application file for complete search history.

(56) References Cited

U.S. PATENT DOCUMENTS

| 4,927,670 | A | 5/1990 | Erbil |
| 5,248,496 | A | 9/1993 | Schuster et al. |
| 5,358,889 | A | 10/1994 | Emesh et al. |
| 5,378,492 | A | 1/1995 | Mashiko |
| 5,496,582 | A | 3/1996 | Mizutani et al. |
| 5,840,897 | A | 11/1998 | Kirlin et al. |
| 6,036,741 | A | 3/2000 | Shindo et al. |
| 6,063,705 | A | 5/2000 | Vaartstra |
| 6,074,945 | A * | 6/2000 | Vaartstra et al. ............... 438/681 |
| 6,133,159 | A * | 10/2000 | Vaartstra et al. ............... 438/758 |
| 6,143,192 | A | 11/2000 | Westmoreland |
| 6,281,125 | B1 | 8/2001 | Vaartstra et al. |
| 6,303,809 | B1 | 10/2001 | Chi et al. |
| 6,458,183 | B1 | 10/2002 | Phillips et al. |
| 6,479,100 | B2 | 11/2002 | Jin et al. |
| 6,537,461 | B1 | 3/2003 | Nakahara et al. |
| 6,541,067 | B1 | 4/2003 | Marsh et al. |
| 6,580,111 | B2 | 6/2003 | Kim et al. |
| 6,605,735 | B2 | 8/2003 | Kawano et al. |
| 6,610,873 | B2 | 8/2003 | Saito |
| 6,656,255 | B2 | 12/2003 | Nasu et al. |
| 6,737,313 | B1 | 5/2004 | Marsh et al. |
| 6,824,824 | B2 | 11/2004 | Saito |
| 6,844,261 | B2 | 1/2005 | Marsh et al. |
| 6,991,003 | B2 | 1/2006 | Calandran, Jr. |
| 7,002,033 | B1 | 2/2006 | Sakai et al. |
| 7,316,962 | B2 | 1/2008 | Govindarajan |
| 7,438,949 | B2 * | 10/2008 | Weidman ....................... 427/250 |
| 7,544,389 | B2 * | 6/2009 | Dussarrat et al. ........... 427/248.1 |
| 7,635,441 | B2 | 12/2009 | Kadokura et al. |
| 7,906,175 | B2 | 3/2011 | Xia et al. |
| 8,133,555 | B2 * | 3/2012 | Shinriki et al. ............... 427/576 |
| 8,329,569 | B2 * | 12/2012 | Li ................................. 438/584 |
| 2002/0004293 | A1 | 1/2002 | Soininen et al. |
| 2002/0142588 | A1 | 10/2002 | Basceri et al. |
| 2002/0149040 | A1 | 10/2002 | Sun et al. |
| 2002/0164887 | A1 | 11/2002 | Tomita et al. |
| 2002/0173054 | A1 | 11/2002 | Kim |
| 2003/0036242 | A1 | 2/2003 | Yang |
| 2003/0037802 | A1 | 2/2003 | Nakahara et al. |
| 2003/0073294 | A1 | 4/2003 | Marsh |
| 2004/0105934 | A1 | 6/2004 | Chang et al. |
| 2004/0241321 | A1 | 12/2004 | Ganguli et al. |
| 2006/0162658 | A1 | 7/2006 | Weidman |

(Continued)

FOREIGN PATENT DOCUMENTS

| EP | 1 717 343 | 11/2006 |
| JP | 57 206210 | 6/1984 |

(Continued)

OTHER PUBLICATIONS

Gatineau, Julien, et al., "A new RuO4 solvent solution for pure ruthenium film depositions." Microelectronic Engineering 83 (2006) 2248-2252.*
Senzaki, Yoshihide, et al., "Chemical Vapor Deposition of Ruthenium and Osmium Thin Films Using (Hexafluoro-2-butyne) tetracarbonylruthenium and -osmium". Chem. Mater. 1993, 5, 1715-1721.*
Aaltonen, T. et al., "Atomic layer deposition of ruthenium thin films from Ru(thd)$_3$ and oxygen," Chemical Vapor Deposition, 2004, 10 (15), pp. 215-219.
Choi, G.-J. et al., "Atomic layer deposition on TiO$_2$ films on Ru buffered TiN electrode for capacitor applications," Journal of the Electrochemical Society. 2009, 156 (7), pp. G71-G77.
Frohlich, K. et al. "Preparation of SrRuO3 films for advanced CMOS metal gates", Material Science in Semiconductor Processing, 2004, 7, pp. 265-269.

(Continued)

*Primary Examiner* — Bret Chen
(74) *Attorney, Agent, or Firm* — Patricia E. McQueeney

(57) ABSTRACT

Disclosed are atomic layer deposition methods using ruthenium-containing precursors to form ruthenium-containing films for use in the manufacture of semiconductor, photovoltaic, LCD-TFT, or flat panel type devices.

8 Claims, 3 Drawing Sheets

(56) References Cited

U.S. PATENT DOCUMENTS

| | | | |
|---|---|---|---|
| 2006/0269667 A1 | 11/2006 | Ma et al. | |
| 2007/0160756 A1 | 7/2007 | Treichel | |
| 2007/0190362 A1 | 8/2007 | Weidman | |
| 2008/0121249 A1 | 5/2008 | Gatineau et al. | |
| 2008/0152793 A1 | 6/2008 | Gatineau et al. | |
| 2008/0171436 A1* | 7/2008 | Koh et al. | 438/681 |
| 2008/0214003 A1* | 9/2008 | Xia et al. | 438/686 |
| 2009/0236568 A1 | 9/2009 | Letessier et al. | |
| 2010/0116738 A1 | 5/2010 | Xia et al. | |
| 2010/0209598 A1* | 8/2010 | Xu et al. | 427/124 |
| 2010/0221577 A1 | 9/2010 | Dussarrat | |
| 2012/0216712 A1* | 8/2012 | Paranjpe et al. | 106/287.18 |

FOREIGN PATENT DOCUMENTS

| | | |
|---|---|---|
| JP | 60 087855 | 5/1985 |
| JP | 63 287549 | 11/1988 |
| JP | 06 009223 | 1/1994 |
| JP | 2000 083929 | 3/2000 |
| JP | 2001 284317 | 10/2001 |
| JP | 2003 027240 | 1/2003 |
| JP | 2005 206874 | 8/2005 |
| KR | 2001 0087782 | 9/2001 |
| KR | 2007 0005870 | 1/2007 |
| KR | 2007 0115146 | 12/2007 |
| KR | 2008 0066619 | 7/2008 |
| KR | 2009 0115155 | 11/2009 |
| WO | WO 00 15865 | 3/2000 |
| WO | WO 2004 046417 | 6/2004 |
| WO | WO 2005 020317 | 3/2005 |
| WO | WO 2006 035281 | 4/2006 |
| WO | WO 2006 057707 | 6/2006 |
| WO | WO 2008 088563 | 7/2008 |
| WO | WO 2009 118708 | 10/2009 |

OTHER PUBLICATIONS

Funakubo, H. et al., "Metal organic chemical vapor deposition growth of epitaxial $SrRuO_3$ and $CaRuO_3$ thin films with different orientations as the bottom electrode for epitaxial ferroelectric thin film," Journal of Crystal Growth, 2002, 235, pp. 401-406.

Han, J.H. et al., "Chemical vapor deposition of Ru thin films with an enhanced morphology, thermal stability and electrical properties using RuO precursor," Chemistry of Materials, 2009, 21 (2), pp. 207-209.

Han, J.H. et al., "Pulsed-chemical vapor deposition of ruthenium and ruthenium dioxide thin films using $RuO_4$ precursor for the DRAM capacitor electrode," ECS Transactions, 2009, 19 (2), p. 717-728.

Higashi, N. et al., "Crystal structure comparison between conductive $SrRuO_3$ and $CaRuO_3$ thin films," Journal of Crystal Growth, 2001, 229, pp. 450-456.

Higashi, N. et al., "Metalorganic chemical vapor deposition of conductive $CaRuO_3$ thin films," Japan Journal of Applied Physics, 2000, 3, pp. 2780-2783.

Higashi, N. et al., "New control method of low deposition temperature limit of metal-organic chemical vapor deposition (MOCVD) by the introduction of organic vapor—Application to $SrRuO_3$ film preparation," Thin Solid Films, 2002, 409, pp. 33-36.

Katamreddy, R. et al., "Tuning of material and electrical properties of strontium titanates using process chemistry and composition," ECS Transactions, 2008, 16 (5), pp. 487-496.

Kwon, O.-K. et al., "PEALD of a ruthenium adhesion layer for copper interconnects," Journal of the Electrochemical Society, 2004, 151 (12), pp. C753-C756.

Lee, J.-H. et al., "Chemical vapor deposition of Ru thin films by direct liquid injection of $Ru(OD)_3$ (OD=octanedionate)," J. Vac., Sci. Techno. A. Sep./Oct. 2000. 18 (5), pp. 2400-2403.

Okuda, N. et al., "Low temperature deposition of $SrRuO_3$ thin film prepared by metalorganic chemical vapor deposition," Japan Journal of Applied Physics, 2000, 39, p. 572-576.

Schwarzkopf, J. et al., "Depositions of $SrRuO_3$ thin films on oxide substrates with liquid-delivery spin MOCVD," Thin Solid Films, 2009, xxx, pp. xxx-xxx.

Shibutami, T. et al., "A novel ruthenium precursor for MOCVD without seed ruthenium layer," Tosoh R&D Review, 2003, 47, pp. 61-63.

Song, Y.W. et al., "Atomic layer deposition of Ru by using a new Ru-precursor," ECS Transactions, 2006, 2 (4), pp. 1-11.

Tapajna, M. et al., "Application of Ru-based gate materials for CMOS technology," Materials Science in Semiconductor Processing, 2004, 7, pp. 271-276.

Vehkamaki, M. et al., "Atomic layer deposition of $SrTiO_3$ thin films from a novel strontium precursor—Strontium-bis(tri-isopropylcyclopentadienyl)," Chemical Vapor Deposition, 2001, 7 (2), p. 75-80.

Vehkamaki, M. et al., "Growth of $SrTiO_3$ and $BaTiO_3$ thin films by atomic layer deposition," Electrochemical and Solid-State Letters, 1999, 2 (10), pp. 504-506.

International Search Report and Written Opinion for corresponding PCT/US2010/061907, Aug. 23, 2011.

3M™ Novec™ Engineered Fluid HFE 7100, 2004.

3M™ Novec™ Engineered Fluid HFE 7200, 2004.

Alaimo et al., "Suggested modifications to a distillation-free solvent purification system," Journal of Chemical Education, vol. 78, No. 1, Jan. 2001.

Burkey, D.J. et al. "Encapsulated alkaline-earth metallocenes. 2. Triisopropylcyclopentadienyl systems, $[(C_3H_7)_3C_5H_2]_2Ae(THF)_n$ (Ae = Ca, Sr, Ba; n = 0-2), and the crystal structure of $[(C_3H_7)_3C_5H_2]_2Ba(THF)_2$,", Organometallics, vol. 12, No. 4, 1993, pp. 1331-1337.

Burkey, D.J. et al., "Encapsulated alkaline earth metallocenes. 3. Structural influences on phase transformations in alkaline earth complexes," Advanced Materials for Optics and Electronics, 1994, vol. 4, pp. 108.

Gatineau, J. et al., "Synthesis and PEALD evaluation of new nickel precursors," Microelectronic Engineering 83 (2006), pp. 2248-2252.

Hatanpaa, T. et al. "Synthesis and Characterisation of Cyclopentadienyl Complexes of Barium: Precursors for Atomic Layer Deposition of BaTiO3", Dalton Transactions, Mar. 8, 2004, pp. 1181-1188.

Igarashi, H. et al. "Absorption behaviour of gaseous ruthenium into water", Radiochimica Acta, 57, 1992, pp. 51-55.

International Technology Roadmap for Semiconductors, "Interconnect", 2007.

Jelenkovic, E.V. et al. "Degradation of RuO2 thin films in hydrogen atmosphere at temperatures between 150 and 250° C.", The Institution of Electrical Engineers, Stevenage, Great Britain, Jan. 2003.

Kang, J.-S. et al. "Metal-organic CVD of a (Ba,Sr)RuO3 oxide electrode using a single cocktail source", Chemical Vapor Deposition, vol. 11, No. 1, Jan. 1, 2005, pp. 17-20.

Kang, S.-Y. et al. "Deposition and characterization of Ru thin films prepared by metallorganic chemical vapor deposition", J. Korean Phys. Soc., 2000, vol. 37, No. 6, pp. 1040-1044.

Kepak, F. et al. "Removal of $RuO_4$ vapors on natural clinoptilolite", J. Radioanalytical and Nucl. Chem., vol. 159, No. 2, pp. 317-334, 1992.

Kepak, F. et al. "Sorption of $^{106}RuO_4$ vapours on molecular sieve Zeolon 500", Isotopenpraxis, 21(2), S.58 bis 62, 1985.

Kepak, F. et al. "Sorption of $^{106}RuO_4$ vapours on natural synthetic molecular sieves", Isotopenpraxis, 26(2), pp. 73-78, 1990.

Kukli, K. et al. "Atomic layer deposition of calcium oxide and calcium hafnium oxide film using calcium cyclopentadienyl precursors", Thin Solid Films, vol. 500, No. 1-2, Apr. 3, 2006, pp. 322-323.

Lai, Y.-H. et al. "Synthesis and characterization of ruthenium complexes with two fluorinated amino alkoxide chelates. The quest to design suitable MOCVD source reagents", Chemistry of Materials American Chem. Soc. USA, vol. 15, No. 12, Jun. 17, 2003, pp. 2454-2462.

Maas, E.T. et al. "Confinement of ruthenium oxides volatized during nuclear fuels reprocessing", Nucl. Technol., 1979.

McMurray, H.N. et al. "Uniform colloids of ruthenium dioxide hydrate evolved by the surface-catalyzed reduction of ruthenium tetroxide," J. Phys. Chem., 1993, 97, 8039-8045.

(56) References Cited

OTHER PUBLICATIONS

Pangborn, A.B. et al., "Safe and convenient procedure for solvent purification," Organometallics 1996, 15, pp. 1518-1520.
Park, S.-E. et al. "Metallorganic chemical vapor deposition of Ru and RuO2 using ruthenocene precursor and oxygen gas", J. Electrochemical Soc., 2000, vol. 147, pp. 203-209.
Sankar, J. et al. "Low temperature chemical vapour deposition of ruthenium and ruthenium dioxide on polymer surfaces", J. Mater. Chem., 1999, 9, pp. 2439-2444.
SciFinder Abstract, "RuO$_4$," American Chemical Society, printed Apr. 19, 2013, 3 pages.
Senzaki, Y. et al., "Chemical vapor deposition of ruthenium and osmium thin films using (hexafluoro-2-butyne)tetracarbonylruthenium and -osmium," Chem. Mater. 1993, 5, p. 1715-1721.
Shibuya, K. et al., "Domain structure of epitaxial CaHfO$_3$ gate insulator films on SrTiO$_3$", Appl. Phys. Let. 84 (2004) 2142-2144.
Shibuya, K. et al., "Growth and structure of wide-gap insulator films on SrTiO$_3$", Solid State Electron., 47 (2003) 2211-2214.
STREM MSDS (Ruthenocene Oct. 2004) {http://www.strem.com/catalog/v3/44-6200/}, Nov. 4, 2011.
Studebaker, D. et al. "Low field, room temperature magnetoresistance in $(La_{1-x}M_x)_yMnO_{3-\delta}$(M=Ca, Sr) thin-films deposited by liquid delivery CVD". Materials Science and Engineering B56 (1998) pp. 168-172.
Sumi, A. et al., "Metalorganic chemical vapor deposition of atomically flat SrRuO$_3$ films on stepped SrTiO$_3$ substrates," Applied Physics Letters 87, 2005, pp. 052112-1-052112-3.
University of California, "Solvent purification using Grubs Apparatus guideline for use," 5 pages; cited by Examiner in related U.S. Appl. No. 12/437,224, Dec. 16, 2010.
Van Der Straten, O. et al., "Metal-organic atomic layer deposition of metals for applications in interconnect technology," ECS Transactions, 2006, 1 (10), pp. 51-56.
Vehkamaki, M. et al. "Atomic layer deposition of batio3 thin films—effect of barium hydroxide formations", Chemical Vapor Deposition, vol. 13, No. 5, May 1, 2007, pp. 239-246.
Vujisic, L. et al. "Adsorption of gaseous RuO4 by various solvents", 17$^{th}$ DOE Nuclear Air Cleaning Conf.
Webster's New World Dictionary, 2$^{nd}$ College Ed., definition of "base," 1972, The World Publishing Company, USA, Library of Congress Card No. 71-182408, p. 116.
Yuan, Z. et al. "Low-temperature chemical vapor deposition of ruthenium dioxide from ruthenium tetroxide: A simple approach to high-purity RuO$_2$ films", Chemistry of Materials, American Chemical Society, Washington, US, vol. 5, No. 7, Jul. 1993, pp. 908-910.
International Search Report and Written Opinion for related PCT/IB2004/004131, May 4, 2005.
International Search Report and Written Opinion for related PCT/IB2005/000835, Jun. 16, 2005.
International Search Report and Written Opinion for related PCT/IB2005/002833, Jan. 18, 2006.
International Search Report and Written Opinion for related PCT/IB2008/051324, Sep. 3, 2008.
International Search Report and Written Opinion for related PCT/IB2008/050637, Feb. 23, 2009.
International Search Report and Written Opinion for related PCT/IB2009/051276, Jul. 6, 2009.
International Search Report and Written Opinion for related PCT/IB2009/051153, Nov. 26, 2009.
Hungarian Written Opinion for related SG 200906120-1 Nov. 15, 2010.

* cited by examiner

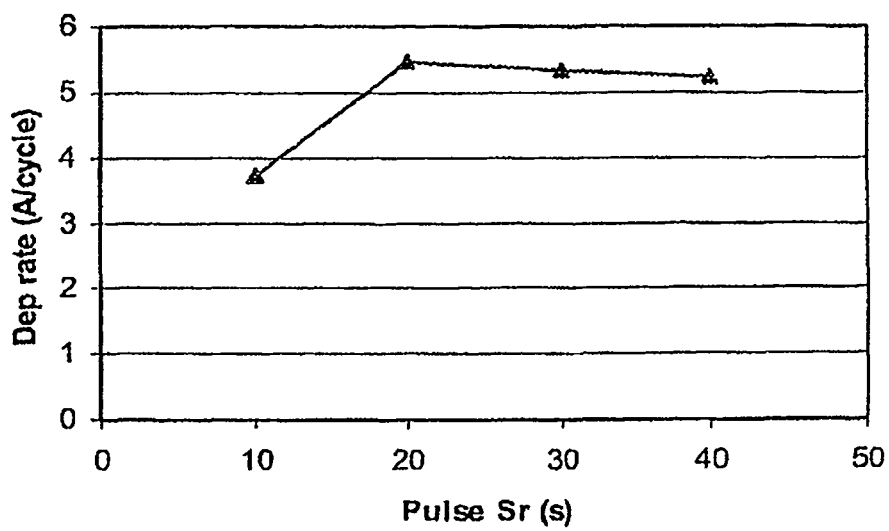
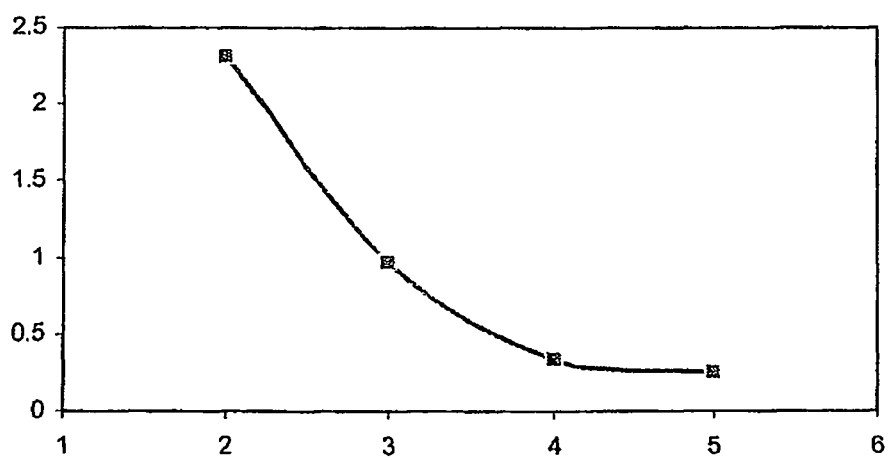

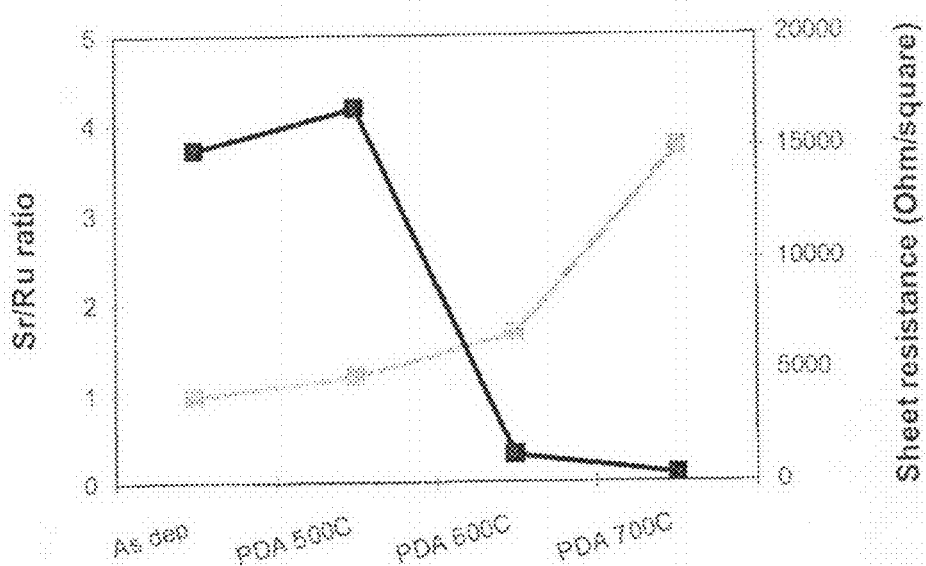
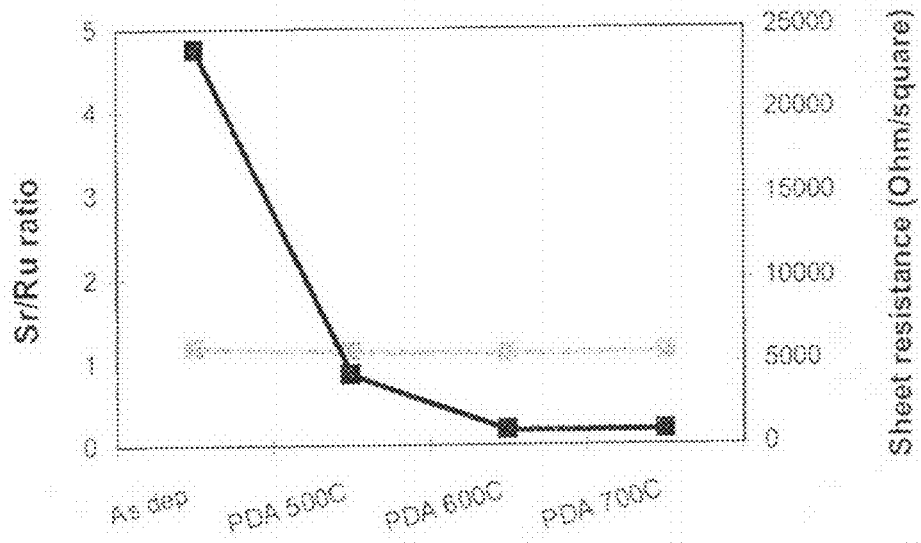

1

USE OF RUTHENIUM TETROXIDE AS A PRECURSOR AND REACTANT FOR THIN FILM DEPOSITIONS

CROSS REFERENCE TO RELATED APPLICATIONS

The present application is a 371 of International PCT Application PCT/US2010/061907, filed Dec. 22, 2010, which claims priority to U.S. Provisional Application Ser. No. 61/307,244 filed Feb. 23, 2010, both applications being herein incorporated by reference in their entireties for all purposes.

FIELD OF THE INVENTION

Disclosed are atomic layer deposition methods, preferably thermal ALD, using ruthenium-containing precursors to form ruthenium-containing films for use in the manufacture of semiconductor, photovoltaic, LCD-TFT, or flat panel type devices.

BACKGROUND

Chemical vapor deposition (CVD) and atomic layer deposition (ALD) have been adopted as techniques for depositing thin films to comply with the scaling down of semiconductor devices. The film growth usually results from the chemical reaction of one or more precursor compounds, so it is essential to develop optimum precursors and understand their reaction process. Sometimes a reactant is introduced to react with the precursor(s), so the choice of an appropriate reactant is also of high importance, as it impacts the film's properties as directly as the precursors. Finally, the deposition process is also important. In some cases the use of a plasma source is necessary to tune the film properties. However, plasma may damage the sub-layers and may not allow deposition of films with a sufficient conformality, especially in deep trenches or holes typically used by memory makers.

Ruthenium (Ru) is a potential candidate for thin film applications in the industrial semiconductor manufacturing process for many applications in the coming years. For the next generation nodes, Ru is considered as one of the best candidates for the electrode capacitor for FeRAM and DRAM applications. Ru has interesting properties, such as a high melting point, low resistivity, high oxidation resistance and adequate work functions, making it also a potential gate electrode material for CMOS transistors.

In view of the aforementioned properties of ruthenium oxide, ruthenium oxide-based materials, such as $CaRuO_3$, $SrRuO_3$ and $BaRuO_3$, may be used as an electrode for ferroelectric and DRAM applications. Strontium ruthenium oxide, $SrRuO_3$ (SRO) films are of interest because they exhibit a perovskite crystal structure whose lattice mismatch with strontium titanium oxide, $SrTiO_3$ (STO) is very small (3.93 Å vs. 3.91 Å). $CaRuO_3$ films are of interest because they exhibit a lower resistivity than SRO. Hence, it is expected that $ARuO_3$ (wherein A=Sr, Ca or Ba) films may be suitable to be used as a conductive layer for gate or electrode applications.

WO2009/118708 discloses methods and compositions for the deposition of ternary oxide films containing ruthenium and an alkali earth metal. In its examples, WO2009/118708 discloses SRO film deposition using $H_2O$ as a reactant in a CVD process and using a mixture of $H_2O$ and oxygen in an ALD process. U.S. Pat. No. 7,544,389 discloses ALD and CVD methods for the deposition of ruthenium and ruthenate films using a solution of ruthenium tetroxide. Specifically, U.S. Pat. No. 7,544,389 discloses Ru film deposition using the $RuO_4$ precursor and $H_2$ as a reactant, $RuO_2$ film deposition using the $RuO_4$ precursor and a heated substrate, and ruthenate film deposition using the $RuO_4$ precursor, an organometallic precursor, and an oxygenated gas, such as $O_2$, $O_3$, or $N_2O$.

When SRO films are deposited, especially using ALD, the fit between strontium and ruthenium precursors is of extreme importance. For example, most of the strontium precursors lead to strontium oxide ($SrO_2$) films when ozone ($O_3$) or moisture ($H_2O$) is used as a reactant, but not oxygen ($O_2$). However, ozone is generally known to be able to react with ruthenium even at 20° C., generating volatile $RuO_4$. Such equilibrium between deposition and "etching" if ozone is used can not be tolerated.

Consequently, there is a need for developing an ALD process that enables the deposition of thin films of $SrRuO_3$ (or $CaRuO_3$ and $BaRuO_3$) having a good uniformity even in most advanced device geometries (aspect ratio of 20:1 or higher) at lower temperatures than the current methods (in other words, at temperatures lower than 350° C.).

BRIEF SUMMARY

Disclosed are atomic layer deposition methods for depositing ruthenium-containing films. The vapors of an organometallic precursor are introduced into a reactor containing one or more substrates. An atomic layer deposition process is used to deposit at least a part of the organometallic precursor as a layer on the substrate(s). The vapors of ruthenium tetroxide ($RuO_4$) are introduced into the reactor. An atomic layer deposition process is used to react the vapors of ruthenium tetroxide with the layer deposited from the vapors of the organometallic precursor and form the ruthenium-containing film. The ruthenium-containing film is formed without the introduction of a separate oxygen-containing reactant. The method may further include one or more of the following aspects:

- the reactor having a temperature between about 50° C. and about 400° C., preferably between about 150° C. and about 250° C.;
- the reactor having a pressure between about 0.013 Pa and about 133 kPa, preferably between about 1.33 Pa and about 13.3 kPa;
- the vapors of ruthenium tetroxide being generated from a blend of $RuO_4$ dissolved in one or more solvents;
- repeating the disclosed atomic layer deposition method at least one time;
- the organometallic precursor being selected from the group consisting of biscyclopentadienyl ruthenium ($RuCp_2$), bis(methylcyclopentadienyl)ruthenium ($Ru(MeCp)_2$), bis(ethylcyclopentadienyl)ruthenium ($Ru(EtCp)_2$), bis(2,6,6-trimethylcyclohexadienyl)ruthenium ($Ru(2,6,6-Me_3-C_6H_4)_2$), bis(2,4-dimethylpentadienyl)ruthenium ($Ru(2,4-Me_2-pentadienyl)_2$), tris(acetylacetonate)ruthenium ($Ru(acac)_3$), tris(tetramethylheptadionato)ruthenium ($Ru(tmhd)_3$), tris(octadionato)ruthenium ($Ru(od)_3$), and mixtures thereof;
- the film being a ruthenium film;
- the organometallic precursor comprising a metal selected from the group consisting of strontium, calcium, barium, and combinations thereof;
- the film being a ruthenate film;
- the organometallic precursor being $Sr(R_nCp)_2$, with R being Me, Et, Pr, or Bu; and n=1-5;
- the film being a $SrRuO_3$ film;

introducing a second organometallic precursor, the second organometallic precursor having the formula $Ba(R_nCp)_2$, wherein R is Me, Et, Pr, or Bu and n=1-5;

the film being $[Ba,Sr]RuO_3$; and the ruthenium tetraoxide being dissolved in a mixture of at least two non-flammable fluorinated solvents, each solvent having the general formula $C_xH_yF_zO_tN_u$, wherein:

i) $x \geq 3$;
ii) $y+z \leq 2x+2$;
iii) $z \geq 1$;
iv) $t \geq 0$;
v) $u \geq 0$; and
vi) $t+u \geq 0$; and
vii) x, y, z, t, and u are all integers; and
viii) the solvent and ruthenium mixture contains less than about 100 ppm of moisture.

BRIEF DESCRIPTION OF THE DRAWINGS

For a further understanding of the nature and objects of the present invention, reference should be made to the following detailed description, taken in conjunction with the accompanying drawings, wherein:

FIG. 1 is a graph illustrating the deposition rate of $SrRuO_x$ films as a function of pulse duration of $Sr(iPr_3Cp)_2$-THF for a film deposited according to embodiments of the disclosed methods;

FIG. 2 is a graph illustrating the film stoichiometry as a function of the pulse of ruthenium tetroxide mixture for a film deposited according to embodiments of the disclosed methods;

FIG. 5 is a graph illustrating the film stoichiometry and resistivity as a function of temperature of post deposition annealing in an oxygen ($O_2$) environment of a film deposited according to embodiments of the disclosed methods; and FIG. 6 is a graph illustrating the film stoichiometry and resistivity as a function of temperature of post deposition annealing in a nitrogen ($N_2$) environment of a film deposited according to embodiments of the disclosed methods.

NOTATION AND NOMENCLATURE

Figure 3:
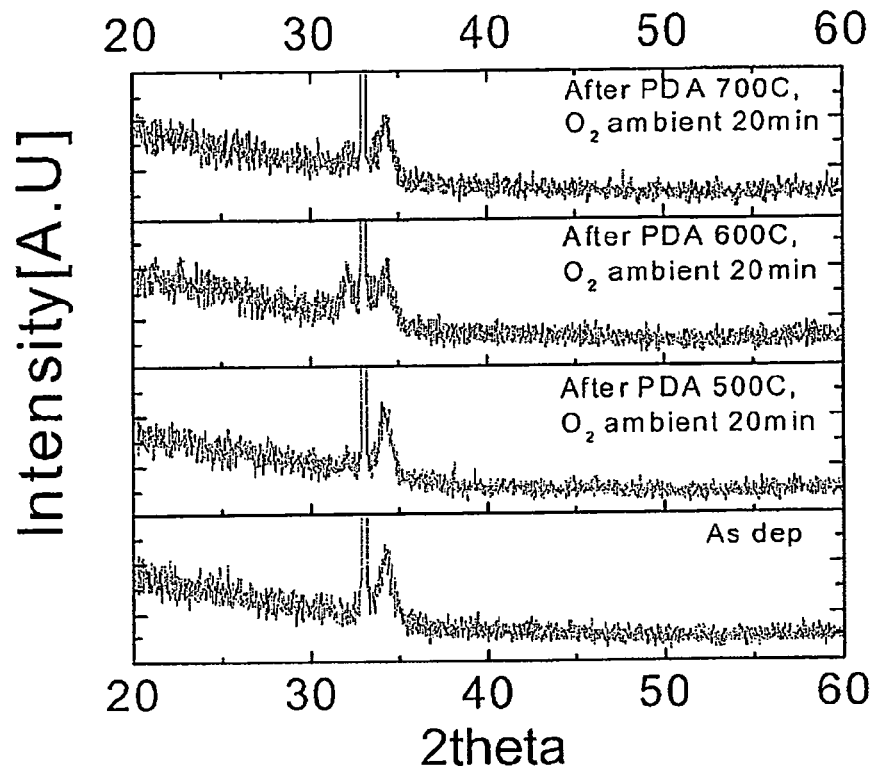
FIG. 3 is a graph illustrating X-ray diffraction results for post deposition annealing in an oxygen ($O_2$) environment at different temperatures of a film deposited according to embodiments of the disclosed methods.

Certain abbreviations, symbols, and terms are used throughout the following description and claims and include: the term "alkyl group" refers to saturated functional groups containing exclusively carbon and hydrogen atoms. Further, the term "alkyl group" refers to linear, branched, or cyclic alkyl groups. Examples of linear alkyl groups include without limitation, methyl groups, ethyl groups, n-propyl groups, n-butyl groups, etc. Examples of branched alkyl groups include without limitation, t-butyl. Examples of cyclic alkyl groups include without limitation, cyclopropyl groups, cyclopentyl groups, cyclohexyl groups, etc.

As used herein, the abbreviation, "Me," refers to a methyl group; the abbreviation, "Et," refers to an ethyl group; the abbreviation, "Pr," refers to a propyl group, whether n-propyl or iso-propyl; the abbreviation, "iPr," refers to an isopropyl group; the abbreviation "Bu" refers to butyl, whether n-butyl, iso-butyl, sec-butyl or tert-butyl; the abbreviation "tBu" refers to tert-butyl; the abbreviation "sBu" refers to sec-butyl; the abbreviation "acac" refers to acetylacetonato; the abbreviation "tmhd" refers to 2,2,6,6-tetramethyl-3,5-heptadionato; the abbreviation "Cp" refers to cyclopentadienyl; the abbreviation "Cp*" refers to pentamethylcyclopentadienyl; the abbreviation [Ba,Sr] refers to any combination of Ba and Sr that totals 100%, for example, $Ba_{0.5}Sr_{0.5}$ or $Ba_{0.2}Sr_{0.8}$.

The standard abbreviations of the elements from the periodic table of elements are used herein. It should be understood that elements may be referred to by these abbreviations (e.g., Ru refers to ruthenium, Sr refers to strontium, etc).

DESCRIPTION OF PREFERRED EMBODIMENTS

Disclosed are atomic layer deposition methods for the deposition of ruthenium-containing films on a substrate. These methods use $RuO_4$ as a source of ruthenium and/or as an oxygen-containing reactant in ALD mode. Thin films of ruthenium may be deposited by atomic layer deposition (ALD) processes by alternately contacting a substrate with an organometallic ruthenium-containing precursor and a $RuO_4$ precursor/reactant. Alternatively, binary or ternary (or more) ruthenium-containing films may be deposited by ALD processes by alternately contacting a substrate with an organometallic precursor containing the other elements and a $RuO_4$ precursor/reactant. In each ALD cycle the substrate is alternately contacted with an organometallic precursor (comprising a metal A, wherein A=Ca, Sr or Ba) and $RuO_4$ (as a ruthenium source and an oxidizing reactant), such that a thin ruthenate film of the formula $ARuO_3$ is formed on the substrate.

The use of $RuO_4$ as both a source for ruthenium and an oxygen-containing reactant in ALD mode is discussed herein. The use of this precursor/reactant provides many advantages compared to other ruthenium-containing precursors due to its high volatility, the high quality of the films obtained, and the resulting stability under thermal stress.

The use of $RuO_4$ as both a ruthenium-containing precursor and a reactant, due to its very strong oxidizing properties, simplifies the deposition processes for Ru-containing films. The use of $RuO_4$ dispenses with the need for typical oxygen-containing reactants (such as $O_2$, $O_3$, $H_2O$). The use of $RuO_4$ may also provide for a higher deposition rate (in the case of Ru ALD, for example), as well as shorter deposition times. Because the use of $RuO_4$ in its pure state is challenging, its use in a solvent blend has been developed.

Non-flammable solvents are preferably used in the $RuO_4$ precursor mixture because non-flammable solvents are preferred when the mixture is used in an environment above room temperature. Non-flammable solvents are also preferred because they generally minimize the risk of introducing carbon into the film deposited on the substrate. Generally, fluorinated solvents are preferred because the presence of fluorine in the solvent molecule makes it non-flammable, while introducing no appreciable negative effect to the film composition.

The solvent mixture comprises at least two solvents, each of which can be described according to the following general formula:

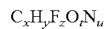

wherein:
$x \geq 3$;
$y+z \leq 2x+2$;
$z \geq 1$;
$t \geq 0$;

u≥0;

t+u≥0; and x, y, z, t, and u are all integers.

Several solvents satisfy this general formula and are suitable for use in the solvent mixture. These solvents include: Methyl perfluoropropyl ether; methyl nonafluorbutyl ether; ethyl nonafluorbutyl ether; 1,1,1,2,2,3,4,5,5,5-decafluoro-3-methoxy-4-(trifluoromethyl)-Pentane; 3-ethoxy-1,1,1,2,3,4,4,5,5,6,6,6-dodecafluoro-2-trifluoromethyl-hexane; $C_9F_{12}N$; $C_{12}F_{27}N$; $C_{12}F_{33}N$; $C_6F_{14}$; $C_8F_{16}$; $C_7F_{16}$; $C_5F_{10}H_2$; $C_4F_5H_5$; 1,1,2,3,3 penta fluoro propane; CF3CFHCF2CH2OCF2CFHOC3F7; and C3F7OCFHCF2CH(CH3)OCF2CFHOC4F9.

Preferably, the solvent mixture is a mixture of methyl nonafluorobutyl ether and ethyl nonafluorbutyl ether. The ratio of these solvents may be between 1:9 and 9:1, or the ratio may preferably be 1:1. Both of these solvents are available commercially from the 3M Company, and are sold under the trade names of Novec HFE 7100 and Novec HFE 7200. $C_5F_{10}H_2$ is also commercially available from DuPont under the trade name of Vertrel.

The $RuO_4$ concentration of the $RuO_4$ precursor mixture is suitably selected as a function of the film formation conditions and the material of the substrate on which the film will be formed.

The disclosed ruthenium tetraoxide precursor offers at least the following advantages.

As $RuO_4$ in pure form poses an explosion risk, the dissolution of $RuO_4$ in a fluorinated solvent mixture enables $RuO_4$ to be handled in a stable form without risk of explosion during storage or holding. The non-flammable solvent mixture does not react with $RuO_4$ and therefore avoids the $RuO_4$ decomposition that occurs with the use of water. This enables stable long-term storage of the ruthenium based precursor.

The desired ruthenium-containing film may in fact be produced since the non-flammable solvent fluorinated solvent in the ruthenium based precursor does not react with $RuO_4$ when this precursor is used in gaseous form to produce film by ALD.

In the case of the current ruthenium based precursor, the non-flammable solvent mixture does not react with the active Ru compounds produced when $RuO_4$ decomposes in the reactor and the solvent mixture is discharged from the reactor along with any unreacted gas.

The non-flammable solvent mixture in the ruthenium based precursor is preferably not toxic. This makes it possible to implement film production in a safe environment when a ruthenium-containing film is produced by ALD using the gaseous ruthenium based precursor.

The fluorinated solvent mixture in the ruthenium based precursor is preferably non flammable and exhibits a high thermal stability, which makes it possible—when this ruthenium based precursor is used in gaseous form for the production of ruthenium-containing film by ALD—to avoid incorporation of carbon into the film as well as decomposition, combustion, or explosion by the solvent mixture.

$RuO_4$ is a high vapor pressure molecule (1.3 kPa at 25° C.) with extreme oxidizing properties. Thus, the disclosed method provides a process that enables the deposition of ruthenium-based films in ALD mode using $RuO_4$ simultaneously as a ruthenium source and an oxygen-containing reactant. As a result, the disclosed methods do not require oxygen-containing reactants to produce the resulting films.

Additionally, a carrier gas may not be required to introduce the $RuO_4$ precursor into the deposition chamber due to its high vapor pressure. Instead, a vacuum may suffice to deliver the vaporized precursor from its container and to the deposition chamber. The vapor flow may be controlled using a valve located on a line connecting the $RuO_4$ precursor container to the reactor. For example, if the valve is a shutoff valve, the flow may be controlled by controlling the length of time the valve is opened.

Alternatively, the $RuO_4$ may be fed in liquid state to a vaporizer where it is vaporized before it is introduced into the reaction chamber. In another alternative, the $RuO_4$ precursor may be vaporized by passing a carrier gas into a container containing the precursor or by bubbling the carrier gas into the precursor. The carrier gas and precursor are then introduced into the reaction chamber. The carrier gas may include, but is not limited to, Ar, He, $N_2$, and mixtures thereof. The container may be maintained at temperatures in the range of, for example, 0° C. to 150° C. Those skilled in the art recognize that the temperature of the container may be adjusted in a known manner to control the amount of precursor vaporized.

More specifically, the $RuO_4$ precursor may be used in the following manners:

Deposition of $ARuO_3$ (A=Ca, Sr, Ba) using $RuO_4$ simultaneously as a ruthenium source and oxygen-containing reactant for the A metal precursor.

The use of $RuO_4$ as a reactant for other organometallic ruthenium precursors ($Ru(EtCp)_2$, $Ru(2,4-Me_2$-pentadienyl$)_2$) may increase the rate of deposition of the ruthenium films (for example, more than one layer of ruthenium may be deposited per cycle, as Ru would also be included during the "reactant" pulse).

Ruthenium-containing films are formed by depositing ruthenium on a substrate by introducing, in gaseous form, at least $RuO_4$ into a reactor that holds the substrate.

An atomic layer deposition (ALD) is used to form the ruthenium-containing film. The ALD process takes place in a reactor containing at least one substrate.

The reactor may be any enclosure or chamber within a device in which deposition methods take place such as, and without limitation, a parallel-plate type reactor, a cold-wall type reactor, a hot-wall type reactor, a single-wafer reactor, a multi-wafer reactor, or other types of deposition systems under conditions suitable to cause the precursors to react and form the layers.

The reactor contains one or more substrates onto which the thin films will be deposited. For example, the deposition chamber may contain from 1 to 200 silicon wafers having from 25.4 mm to 450 mm diameters. The one or more substrates may be any suitable substrate used in semiconductor, photovoltaic, flat panel or LCD-TFT device manufacturing.

The substrate on which the ruthenium containing film is deposited may vary. The substrate may be a semiconductor substrate which may already have other layers of materials deposited upon it from other semiconductor manufacturing steps. The substrate may also be a ceramic substrate (e.g. silicon dioxide, etc), a metallic substrate, or a polymer substrate.

The substrate may be flat, such as a typical semiconductor wafer, or a ceramic substrate for hybrid circuits. The substrate may also be a bumped or a ball shaped surface. The substrate may also be a nanoparticle or another material characterized by a large specific surface area.

Among possible ruthenium-containing films, the following are specifically described below: 1) a method for forming ruthenium film, and 2) a method for forming ruthenate film containing at least one metal selected from strontium, calcium and barium.

Method of Forming Ruthenium Film

The ruthenium film may be formed by alternately introducing an organometallic ruthenium-containing precursor in gaseous form and gaseous $RuO_4$ into the reactor that holds one or more substrates and depositing ruthenium on the substrate(s) by reacting the organometallic ruthenium-containing precursor with the gaseous $RuO_4$ reducing agent.

Exemplary organometallic ruthenium-containing precursors include biscyclopentadienyl ruthenium ($RuCp_2$), bis(methylcyclopentadienyl)ruthenium ($Ru(MeCp)_2$), bis(ethylcyclopentadienyl)ruthenium ($Ru(EtCp)_2$), bis(2,6,6-trimethylcyclohexadienyl)ruthenium ($Ru(2,6,6-Me_3-C_6H_4)_2$), bis(2,4-dimethylpentadienyl)ruthenium ($Ru(2,4-Me_2-pentadienyl)_2$), tris(acetylacetonate)ruthenium ($Ru(acac)_3$), tris(tetramethylheptadionato)ruthenium ($Ru(tmhd)_3$), tris(octadionato)ruthenium ($Ru(od)_3$) and mixtures thereof.

The organometallic ruthenium-containing precursors may be supplied either in neat form or in a blend with a suitable solvent, such as ethyl benzene, xylenes, mesitylene, decane, or dodecane. If blended with a solvent, the organometallic ruthenium-containing precursors may be present in varying concentrations in the solvent.

The organometallic ruthenium-containing precursor is introduced into the reactor in vapor form. The vapor form may be produced by vaporizing the neat or blended precursor solution through a conventional vaporization step such as direct vaporization, distillation, or by bubbling. The organometallic ruthenium-containing precursor may be fed in liquid state to a vaporizer where it is vaporized before it is introduced into the reactor. Alternatively, the organometallic ruthenium-containing precursor may be vaporized by passing a carrier gas into a container containing the ruthenium-containing precursors or by bubbling the carrier gas into the ruthenium-containing precursors. The carrier gas may include, but is not limited to, Ar, He, $N_2$, and mixtures thereof. Bubbling with a carrier gas may also remove any dissolved oxygen present in the neat or blended precursor solution. The carrier gas and organometallic ruthenium-containing precursors are then introduced into the reactor as a vapor.

If necessary, the container containing the organometallic ruthenium-containing precursor may be heated to a temperature that permits the precursor to be in liquid phase and to have a sufficient vapor pressure. The container may be maintained at temperatures in the range of, for example, approximately 0° C. to approximately 150° C. Those skilled in the art recognize that the temperature of the container may be adjusted in a known manner to control the amount of precursor vaporized.

The temperature and the pressure within the reactor are held at conditions suitable for the deposition process. For instance, the pressure in the reactor may be held between about 0.013 Pa and about 133 kPa, preferably between about 1.33 Pa and 13.3 kPa, as required by the deposition parameters. Likewise, the temperature in the reactor may be held between about 50° C. and about 400° C., and preferably between about 150° C. and about 250° C.

After the vapor of the organometallic ruthenium-containing precursor is introduced into the reactor, the temperature and pressure conditions within the reactor permit formation of a very thin layer (e.g., a monoatomic layer) of at least part of the organometallic ruthenium-containing precursor on the substrate by chemisorption. The interior of the reactor may then be purged with an inert gas (e.g., nitrogen, helium) in order to remove unreacted (unabsorbed) ruthenium precursor. This purge is followed by the introduction of the $RuO_4$ precursor/reactant into the reactor. Once again, the conditions within the reactor permit the incoming $RuO_4$ to react with the monoatomic layer formed on the substrate and may result in deposition of an additional layer of ruthenium metal. Unreacted $RuO_4$ precursor is removed with an inert gas purge. In this embodiment, a ruthenium film is deposited. When a thicker ruthenium film is desired, the entire sequence may be repeated.

Method of Forming Ruthenate Film

The binary ruthenate film (such as $SrRuO_3$ (SRO), $CaRuO_3$ (CRO), or $BaRuO_3$ (BRO)) may be formed by introducing a gaseous organometallic precursor (comprising a metal A other than ruthenium) followed by $RuO_4$ in gaseous form into a reactor that holds a substrate and reacting the organometallic precursor and $RuO_4$ to deposit ruthenate on the surface of the substrate. In one embodiment, the process consists essentially of pulses and purges of one or more organometallic precursors and the $RuO_4$ precursor. The deposition produces acceptable ruthenate films without introducing an additional oxidizing agent because the $RuO_4$ acts as the oxidant.

The organometallic precursor may comprise strontium, calcium or barium. For example, the organometallic precursor may have the formula $M(R_nCp)_2$, with M being Ba, Ca, or Sr; R being Me, Et, Pr, Bu; and n being 1-5. Exemplary precursors include $Sr(Me_5Cp)_2$, $Sr(iPr_3Cp)_2$-THF, $Sr(tBu_3Cp)_2$, and $Sr(Me_4EtCp)_2$. Additional precursors may be added to the process to form ternary ruthenate films, such as $[Ba,Sr]RuO_3$.

The organometallic precursor may be supplied either in neat form or in a blend with a suitable solvent, such as ethyl benzene, xylenes, mesitylene, decane, or dodecane. The organometallic precursor may also be dissolved in a solvent that is identical to the precursor's Lewis base (i.e. THF or tetrahydrofuran). The organometallic precursor may be present in varying concentrations in the solvent.

The neat or blended organometallic precursor is introduced into the reactor in vapor form. The vapor form may be produced by vaporizing the neat or blended precursor solution through a conventional vaporization step such as direct vaporization, distillation, or by bubbling. The neat or blended precursors may be fed in liquid state to a vaporizer where it is vaporized before it is introduced into the reactor. Alternatively, the neat or blended precursors may be vaporized by passing a carrier gas into a container containing the disclosed precursors or by bubbling the carrier gas into the disclosed precursors. The carrier gas may include, but is not limited to, Ar, He, $N_2$, and mixtures thereof. Bubbling with a carrier gas may also remove any dissolved oxygen present in the neat or blended precursor solution. The carrier gas and disclosed precursors are then introduced into the reactor as a vapor.

If necessary, the container containing the organometallic precursor may be heated to a temperature that permits the precursor to be in liquid phase and to have a sufficient vapor pressure. The container may be maintained at temperatures in the range of, for example, approximately 0° C. to approximately 150° C. Those skilled in the art recognize that the temperature of the container may be adjusted in a known manner to control the amount of precursor vaporized.

The temperature and the pressure within the reactor are held at conditions suitable for the deposition process. For instance, the pressure in the reactor may be held between about 0.013 Pa and about 133 kPa, preferably between about 1.33 Pa and 13.3 kPa, as required by the deposition parameters. Likewise, the temperature in the reactor may be held between about 50° C. and about 400° C., and preferably between about 150° C. and about 250° C.

After the vapors of the organometallic precursor are introduced into the reactor, the temperature and pressure conditions within the reactor permit formation of a very thin layer (e.g., a monoatomic layer) of at least a portion of the organometallic precursor on the substrate by chemisorption. The interior of the reactor may then be purged with an inert gas (e.g., nitrogen, helium) in order to remove unreacted (unabsorbed) organometallic precursor. This purge is followed by the introduction of the $RuO_4$ precursor/reactant into the reactor. Once again, the conditions within the reactor permit the incoming $RuO_4$ to react with the monoatomic layer formed on the substrate and deposit a ruthenium oxide layer. Unreacted $RuO_4$ precursor is removed with an inert gas purge. When a thicker ruthenate film is desired, the sequence may be repeated. In this embodiment, a ruthenate film is deposited.

The ruthenate films (e.g., SRO, CRO and BRO) produced by this method exhibit ferroelectric properties and may be used, for example, in capacitors. Moreover, since thin ferroelectric films may be produced by this method, these films can be used as electrode materials just like the Ru films and $RuO_2$ films. In specific terms, these ferroelectric films (particularly $SrRuO_x$) may be used as the upper and lower electrode materials for a separate ferroelectric (or as a buffer layer between a ferroelectric and the electrode material). These ferroelectric films, being oxides, may prevent oxygen and PbO diffusion with respect to ferroelectrics such as lead lanthanate titanate (PLT) and lead zirconate titanate (PZT), and at the same time, by adopting the same perovskite structure as these ferroelectrics, may increase the adherence at the interface of the electrode material with these ferroelectrics and prevent or lessen, inter alia, generation of the low dielectric constant layer that may occur at this interface and may prevent or lessen deterioration.

EXAMPLES

The following non-limiting examples are provided to further illustrate embodiments of the invention. However, the examples are not intended to be all inclusive and are not intended to limit the scope of the invention described herein.

Prophetic Example 1

Deposition of Ruthenium Films Using $Ru(EtCp)_2$ and $RuO_4$

A solvent blend of $RuO_4$ may be prepared and stored in a canister dipped in a water bath kept at 3° C. to 5° C. Vapors may be introduced into the reactor by pulling vacuum, as the $RuO_4$ vapor pressure is sufficiently high. $Ru(EtCp)_2$ may be stored in a canister heated at 105° C., the temperature at which the molecule is liquid and at which the vapor pressure is sufficiently high. Vapors may be introduced into the reactor by bubbling, the lines being heated to 115° C.

The reactor may be a cold wall furnace having a volume of 4 L whose walls are heated at 115° C. to avoid condensation of the precursors. The deposition pressure may be set at about 66.7 Pa, for a total of 200 sccm (standard cubic centimeters per minute) of $N_2$ flowing into the furnace.

Depositions may be performed on silicon and silicon oxide. Vapors of the precursors may be introduced into the reactor separately, separated by $N_2$ purge, in accordance with ALD theory.

Films may be obtained at 230° C. and the effect of the duration of the $Ru(EtCp)_2$ pulse, X, into the furnace may be determined. The vapor introduction scheme may be: $RuO_4$: 2 sec/$N_2$: 10 sec/$Ru(EtCp)_2$: X sec/$N_2$: 15 sec. When the $Ru(EtCp)_2$ pulse time increases from 5 to 30 seconds, it is expected that a saturation regime may be obtained at around 20 seconds.

The deposition rate of this process is expected to be twice that of a process that uses oxygen instead of $RuO_4$, due to the Ru-donor capacity of $RuO_4$ (2 Ru steps during 1 cycle, instead of one in the standard case). The films obtained are ruthenium films. If some oxygen remains in the film and must be removed, a post-treatment process may be performed using $H_2$ at a temperature above 150° C.

Example 2

Deposition of $SrRuO_3$ Films Using $Sr(iPr_3Cp)_2$-THF and $RuO_4$

A solvent blend of $RuO_4$ was prepared and stored in a canister dipped in a water bath kept at a temperature of 3° C. to 5° C. Vapors were introduced into the reactor by pulling vacuum, as the vapor pressure of the $RuO_4$ is sufficiently high. $Sr(iPr_3Cp)_2$-THF was stored in a canister heated at 105° C., the temperature at which the molecule is liquid. Vapors were introduced into the reactor by bubbling, the lines being heated at 115° C. $Sr(iPr_3Cp)_2$-THF was introduced at a rate of about 0.1 sccm (standard cubic centimeters per minute).

The reactor is a cold wall furnace having a volume of 4 L whose walls were heated to 115° C. to avoid condensation of the precursors. The deposition pressure was set at 66.7 Pa, for a total of 80 sccm of the carrier gas $N_2$ flowing into the furnace.

Depositions were performed on silicon, silicon oxide, and ruthenium wafers. Vapors of the precursors were introduced into the reactor separately, separated by $N_2$ purge, in accordance to the ALD theory.

Films were usually obtained at 200° C. and the effect of the length of the $Sr(iPr_3Cp)_2$-THF introduction time (pulse), X, into the furnace was observed. The vapor introduction scheme was: $Sr(iPr_3Cp)_2$-THF: X sec/$N_2$: 40 sec/$RuO_4$: 2 sec/$N_2$: 10 sec. It was found that when the $Sr(iPr_3Cp)_2$-THF pulse time increased from 10 to 40 seconds, a saturation regime was obtained at around 30 seconds.

FIG. 1 illustrates the deposition rate of $SrRuO_x$ films on a $SiO_2$ substrate as a function of the duration of the $Sr(iPr_3Cp)_2$-THF pulse. As shown in FIG. 1, the growth rate of $SrRuO_x$ films (measured by ellipsometry technique), became constant even though the pulse time was increased, which is typical behavior in ALD processes.

FIG. 2 illustrates the film stoichiometry as a function of the pulse number of $RuO_4$ for the SRO deposition described above on a silicon dioxide substrate. The strontium precursor ($Sr(iPr_3Cp)_2$-THF) was introduced in four pulses. As shown in FIG. 2, the ratio of strontium to ruthenium decreased as the number of pulses of $RuO_4$ increased, and became about 1:1 after 3 pulses of $RuO_4$.

Figure 4:
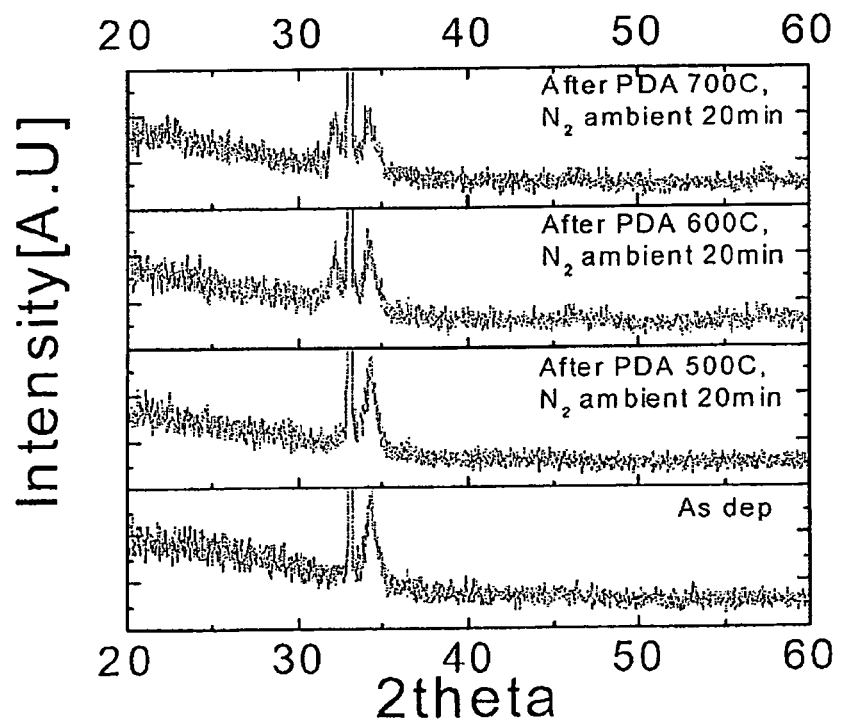
FIG. 4 is a graph illustrating X-ray diffraction results for post deposition annealing in a nitrogen ($N_2$) environment at different temperatures of a film deposited according to embodiments of the disclosed methods.

FIGS. 3 and 4 illustrate the effect of post-deposition annealing on crystallinity at different annealing temperatures after the SRO film was deposited as described above with 3 pulses of $RuO_4$ and 4 pulses of $Sr(iPr_3Cp)_2$-THF. FIG. 3 shows the results of post-deposition annealing in a conventional furnace in an oxygen ($O_2$) environment for 20 minutes. FIG. 4 shows the results of post-deposition annealing in a conventional furnace in a nitrogen ($N_2$) environment for 20 minutes. As shown in FIGS. 3 and 4, the deposited SRO films are amorphous and the crystallization of the SRO film observed between 500° C. and 600° C. is independent of the post-deposition anneal atmosphere.

FIGS. 5 and 6 illustrate the effect of post-deposition annealing (PDA) on resistivity after an SRO film was deposited as described above with 3 pulses of $RuO_4$ and 4 pulses of $Sr(iPr_3Cp)_2$-THF. FIG. 5 shows the ratio of strontium to ruthenium and sheet resistance of the SRO film when post-deposition annealing was performed in a conventional furnace in an oxygen ($O_2$) environment for 20 minutes. The measured values for the Sr/Ru ratio are as follows:

| | |
|---|---|
| As deposited | Sr/Ru = 0.83 |
| After PDA $SiO_2$ at 500° C. | Sr/Ru = 1.18 |
| After PDA $SiO_2$ at 600° C. | Sr/Ru = 1.67 |
| After PDA $SiO_2$ at 700° C. | Sr/Ru = 3.75 |

FIG. 6 shows the ratio of strontium to ruthenium and sheet resistance of the SRO film when post-deposition annealing was performed in a conventional furnace in a nitrogen ($N_2$) environment for 20 minutes. The measured values for the Sr/Ru ratio are as follows:

| | |
|---|---|
| As deposited | Sr/Ru = 1.17 |
| After PDA $SiO_2$ at 500° C. | Sr/Ru = 1.13 |
| After PDA $SiO_2$ at 600° C. | Sr/Ru = 1.10 |
| After PDA $SiO_2$ at 700° C. | Sr/Ru = 1.11 |

As shown in FIGS. 5 and 6, when post-deposition annealing was performed in an oxygen atmosphere, the ratio of Sr/Ru increased. However, when post-deposition annealing was performed in a nitrogen atmosphere, there was no significant variation in the ratio of Sr/Ru up to a temperature of 700° C. Furthermore, regardless of the type of annealing environment (oxygen or nitrogen), the sheet resistance decreased drastically as the post-deposition annealing temperature increased. After post-deposition annealing at 600° C., the resistivity was measured at about 2954 $\mu\Omega$*cm, similar to that of SRO film deposited by sputtering techniques.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. An atomic layer deposition method for depositing a ruthenium-containing film onto one or more substrates, the method comprising the steps of:
   a) introducing vapors of an organometallic precursor into a reactor containing at least one substrate, the organometallic precursor comprising a metal selected from the group consisting of strontium, calcium, barium, and combinations thereof;
   b) depositing at least a part of the organometallic precursor onto the at least one substrate to form a layer using an atomic layer deposition process;
   c) introducing vapors of ruthenium tetroxide ($RuO_4$) into the reactor; and
   d) reacting the vapors of ruthenium tetroxide with the layer deposited in step (b) to form the ruthenium-containing film using an atomic layer deposition process,
   wherein the ruthenium-containing film is a ruthenate film and is formed without the introduction of a separate oxygen-containing reactant.

2. The method of claim 1, wherein the reactor has a temperature between about 50° C. and about 400° C.

3. The method of claim 2, wherein the ruthenium tetraoxide is dissolved in a mixture of at least two non-flammable fluorinated solvents, each solvent having the general formula $C_xH_yF_zO_tN_u$, wherein:
   i) $x \geq 3$;
   ii) $y+z \leq 2x+2$;
   iii) $z \geq 1$;
   iv) $t \geq 0$;
   v) $u \geq 0$; and
   vi) $t+u \geq 0$; and
   vii) x, y, z, t, and u are all integers; and
   viii) the solvent and ruthenium mixture contains less than about 100 ppm of moisture.

4. The method of claim 1, wherein the reactor has a pressure between about 0.013 Pa and about 133 kPa.

5. The method of claim 1, wherein the vapors of ruthenium tetroxide are generated from a blend of $RuO_4$ dissolved in one or more solvents.

6. The method of claim 1, further comprising repeating steps a) through d) at least one time.

7. The method of claim 1, wherein:
   the organometallic precursor is $Sr(R_nCp)_2$, with R being Me, Et, Pr, or Bu and n=1-5; and
   the film is a $SrRuO_3$ film.

8. The method of claim 7, further comprising introducing a second organometallic precursor, the second organometallic precursor having the formula $Ba(R_nCp)_2$, wherein R is Me, Et, Pr, or Bu and n=1-5, and
   the film is $[Ba,Sr]RuO_3$.

* * * * *